United States Patent [19]

Wellheuser et al.

[11] Patent Number: 5,023,487
[45] Date of Patent: Jun. 11, 1991

[54] ECL/TTL-CMOS TRANSLATOR BUS INTERFACE ARCHITECTURE

[75] Inventors: Christopher M. Wellheuser, Sherman; Richard T. Moore, Denison, both of Tex.

[73] Assignee: Texas Instruments Incorporated, Dallas, Tex.

[21] Appl. No.: 416,193

[22] Filed: Sep. 29, 1989

[51] Int. Cl.⁵ .................. H03K 19/094; H03K 17/30
[52] U.S. Cl. ................................. 307/475; 307/455; 307/413
[58] Field of Search ............... 307/475, 443, 455, 446, 307/473; 364/200

[56] References Cited
U.S. PATENT DOCUMENTS

| 3,986,045 | 10/1976 | Lutz | 307/475 |
|---|---|---|---|
| 4,472,647 | 9/1984 | Allgood et al. | 307/475 |
| 4,527,079 | 7/1985 | Thompson | 307/475 |
| 4,563,601 | 1/1986 | Asano et al. | 307/433 |
| 4,677,320 | 6/1987 | Hannington | 307/473 |
| 4,697,109 | 9/1987 | Honma et al. | 307/450 |
| 4,890,019 | 12/1989 | Hoyte et al. | 307/475 |
| 4,931,672 | 6/1990 | Khan | 307/455 |

Primary Examiner—David Hudspeth
Assistant Examiner—Andrew Sanders
Attorney, Agent, or Firm—B. Peter Barndt; James T. Comfort; Melvin Sharp

[57] ABSTRACT

Described is an architecture for translating between ECL and TTL/CMOS signal levels in which the control signal applied to the translating circuitry is of the same type as the output signal of the device in which the architecture is used.

14 Claims, 2 Drawing Sheets

ECL/TTL-CMOS TRANSLATOR BUS INTERFACE ARCHITECTURE

BACKGROUND OF THE INVENTION

1. Field of the Invention

The invention pertains to translation from one signal environment to another and more particularly to an interface architecture for an electronic communication/data processing system providing translation between an emitter coupled logic (ECL) signal environment and a transistor-transistor logic (TTL) or complementary metal-oxide-semiconductor (CMOS) signal environment.

2. Description of Prior Art

As the design of integrated circuits has advanced and as their use has spread into virtually all sectors of technology, distinct families of logic circuits have evolved such as ECL, TTL, CMOS, BiCMOS and the like. Depending on whether an engineer is designing a customized chip, a multi-chip array or an entire system, design constraints such as propagation delay, power dissipation, noise margin, fan-out, size packaging, required power supply(s) and the like will determine which family or families of circuits should be used. Because each chip or system is virtually certain to require interfacing with other chips or systems having different design constraints and applications, communication between different signal environments and system architectures has been a persistent and growing problem. Fundamental to communication between signal environments is the consideration and definition of the logic levels of the input signals which operate the control input terminals or pins of the individual integrated circuits. Different families of logic circuits have different logic levels of input/output signals.

In large complex systems such as processors, for example, translation from one logic level to another generally occurs at a bus interface where most data is transmitted. The control of the devices performing the translation between signal environments or logic levels becomes in this instance a primary consideration. Conventional approaches to translation assume that the logic levels of the input signals which operate the control input pins originate from a single signal environment or logic family. With modern systems, this assumption is not always true. Thus, a need has arisen for a single effective translator between signal environments that can operate with input control signals having different logic levels originating from different signal environments.

BRIEF SUMMARY OF THE INVENTION

A principal object of invention is to provide a translator architecture for controlling translation between signal environments.

A further object of invention is to provide a bus interface architecture whereby input control signals from several signal environments having different logic levels control translation of signals from one signal environment or logic to another.

With the above and other objects in view, a circuit architecture is described wherein the output enable pins for a buffer, transceiver, or storage buffer, for example, may be controlled by a single control signal independent of the environment which originated the control signal, where the output control signal originates from the same signal environment as the device it controls or where the input control signal originates from the same signal environmental as the input signal to the device it controls.

DESCRIPTION OF THE ORIGINAL DRAWINGS

DESCRIPTION OF THE PREFERRED EMBODIMENT

The present invention defines the architecture for a class of ECL/TTL and ECL/CMOS products that provides the efficient translation function between an ECL signal environment and a TTL or CMOS signal environment. Devices in this family include true and inverting versions of the following functions: buffers, transceivers, latches, flip-flops, latching transceivers, registered transceivers, and transceivers with transparent latches and D-type flip-flop storage capabilities. The control architecture to be described applies to both, but is not limited in scope to these implementations. Variations in drive capability, pin-out, bit-extensions, or even technology would not necessarily exclude other devices from application of these principles.

Figure 1:
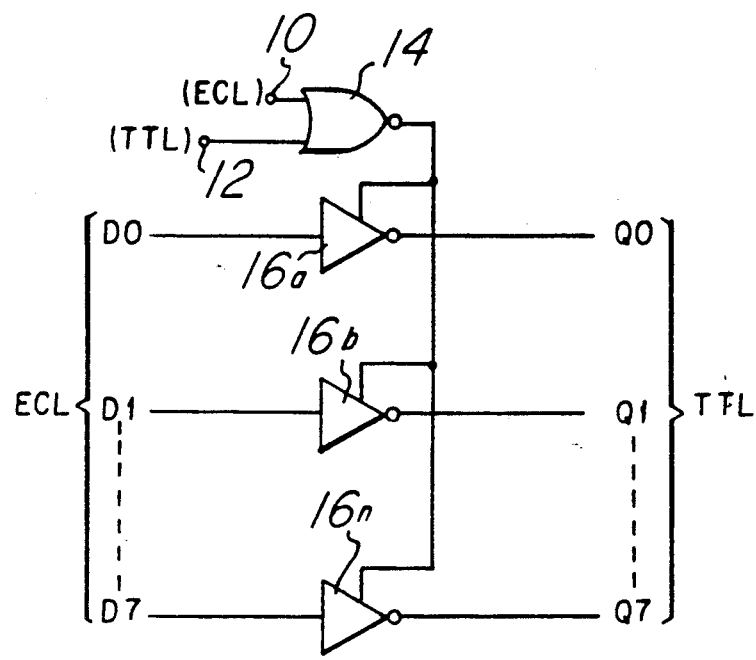
FIG. 1 illustrates a block diagram of an inverting buffer constructed according to the architecture of the present invention.
Figure 2:
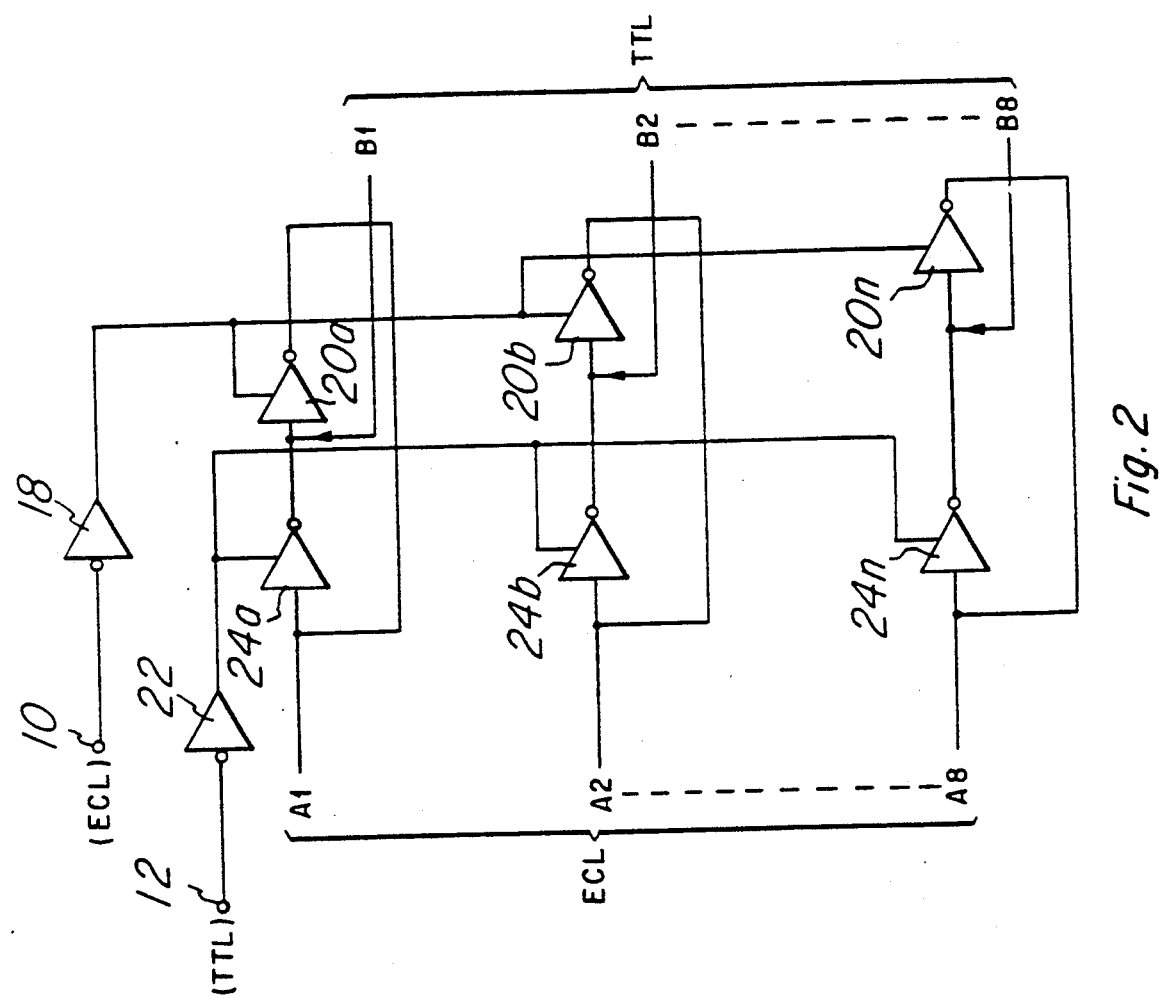
FIG. 2 illustrates a block diagram of a transceiver constructed according to the architecture of the present invention.

Central to the proposed architecture is the definition of the input logic levels of the control pins on each device. With reference to FIG. 1. an 8-bit ECL to TTL or CMOS buffer function is illustrated in which two pins 10 and 12 are allowed for output enable control. The buffer converts ECL logic inputs $D_0, D_1, \ldots D_7$ to TTL or CMOS logic outputs $Q_0, Q_1, \ldots Q_7$. Pins 10 and 12 are the input to a NOR circuit 14 in which one input is ECL compatible and the other is TTL or CMOS compatible. This offers the choice of controlling the outputs of the buffer from either signal environment by a single signal controlling the translators 16. An 8-bit TTL or CMOS to ECL buffer may be similarly constructed. For the 8-bit transceiver function shown in FIG. 2, the enable pin 12 for the TTL or CMOS port will be TTL or CMOS compatible (respectively), while the enable pin 10 for the ECL port will be ECL compatible. ECL input/output pins are represented by $A_1, A_2, \ldots A_8$ and respective TTL or CMOS input/output pins are represented by $B_1, B_2, \ldots B_8$. The output of buffer 18 will control the translators 20 translating from the TTL or CMOS to the ECL signal environment and the output of buffer 22 will control the translators 24 translating from the ECL to the TTL or CMOS signal environment. Buffers 18 and 22 may be of the inverting amplifier or non-inverting amplifier type, depending on the requirements of translators 20 and 24 (respectively). Clearly, when translating from ECL to TTL or CMOS logic levels, the outputs of translators 20 are disabled and when translating from TTL or CMOS to ECL logic levels, the outputs of translators 24 are disabled. Such a device offers the technical advantage of controlling the outputs of the transceiver from either signal environment, unlike conventional devices.

Figure 3:
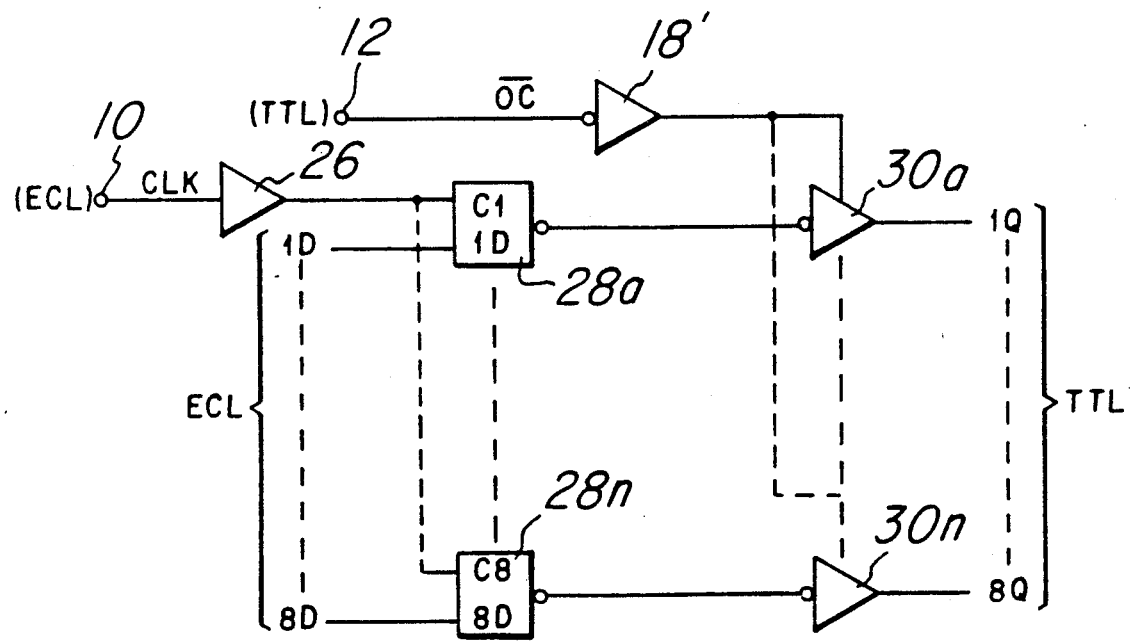
FIG. 3 illustrates a block diagram of an inverting buffer with storage constructed according to the architecture of the present invention.

For the storage types of functions such as transparent latches and D-type flip-flops an inverting buffer with storage may be used as shown in FIG. 3. An ECL to TTL or CMOS buffer is shown which converts ECL inputs 1D... 8D to respective TTL or CMOS outputs 1Q... 8Q. The storage function is provided by storage registers 26. Translators 28 provide the TTL or CMOS output and are enabled by a signal from buffer 22. A TTL or CMOS to ECL buffer with storage may be similarly constructed. The storage register enable or clock pin 10, which is an input to storage register enable buffer 18, will be ECL compatible when translating from an ECL environment to a TTL or CMOS environment and TTL or CMOS compatible when translating from a TTL or CMOS environment to an ECL environment. This gives the advantage of having the data and clock (or latch enable) signals be of the same type, simplifying set-up and hold timing problems. The output enable control of this buffer will be TTL or CMOS compatible when going from ECL to TTL or CMOS logic levels and ECL compatible when going from TTL or CMOS to ECL logic levels.

This configuration will be convenient from a bus interface standpoint in that the output enable signal, pin 12 which controls transmission of the output signals 1Q... 8Q to the bus environment is of the same signal type as that of the output signals. In this respect, the control signal can also act as a flag to notify the processor that it is ready to accept data.

The basic driver, transceiver and storage functions described above can be expanded to such combinations of functions as storage transceivers and the like while still retaining the same type of control logic architecture. Such combinations of the functional embodiments described herein by way of example and not limitation are envisioned as within the ordinary skill of those practicing in the art and are submitted as within the scope and limitations of the appended claims.

We claim:

1. A translation architecture for a signal processor for translation from one signal environment to another, said architecture comprising:
   a first input line for receiving a first control signal from a first signal environment;
   a second input line for receiving a second control signal from a second signal environment;
   logic circuitry coupled between said first and second input lines and a plurality of translator circuits, said logic circuitry transmitting a third control signal in response to receiving said first or said second control signal; and
   each said translator circuit receiving a respective data signal from said first signal environment and said third control signal and transmitting an output signal in said second signal environment.

2. The translation architecture of claim 1 wherein said logic circuitry comprises a logic element receiving as input an ECL logic signal and one of the set of a TTL logic signal and a CMOS logic signal and having an output.

3. The translation architecture of claim 1 wherein each said translator circuit is a three-state device.

4. The translation architecture of claim 1 wherein said first control signals are ECL control signals.

5. The translation architecture of claim 1 wherein said second control signals are comprised of one of the set of TTL and CMOS control signals.

6. A transceiver architecture for use in a computer processor, said architecture comprising:
   a first input line for receiving a first control signal having first logic levels;
   a second input line for receiving a second control signal having second logic levels;
   first buffer circuitry coupled between said first input line and a first plurality of translator circuits, each of said first plurality of translator circuits coupled to receive said first control signals from said first input line and a first data signal composed of said second logic levels and transmitting a first output signal composed of said first logic levels; and
   second buffer circuitry coupled between said second input line and a second plurality of translator circuits, each of said second plurality of translator circuits coupled to receive said second control signals from said second input line and a second data signal composed of first logic levels and transmitting a second output signal composed of said second logic levels.

7. The transceiver architecture of claim 6 wherein said first buffer circuitry is one of the set of an inverting amplifier circuit and a non-inverting amplifier circuit.

8. The transceiver architecture of claim 6 wherein said second buffer circuitry is one of the set of an inverting amplifier circuit and a non-inverting amplifier circuit.

9. The transceiver architecture of claim 6 wherein each said first and second translator circuit is a three-state device.

10. The transceiver architecture of claim 6 wherein said first logic levels are ECL logic levels and said second logic levels are composed of one of the set of TTL and CMOS logic levels.

11. A translating architecture for use in a data processing system, said architecture acting to store and translate signals in one environment to signals in another environment and comprising:
    a first input line receiving a first control signal from a first signal environment;
    a second input line receiving a second control signal from a second signal environment;
    first buffer circuitry coupled between said first input line and a plurality of storage registers, each said storage register receiving said first control signal and one of a plurality of data signals from said first signal environment, each said storage register having an output; and
    second buffer circuitry coupled between said second input line and a plurality of translator circuits, each of said translator circuits coupled to receive said second control signal and a respective one of said storage register outputs and outputting a signal in said second signal environment.

12. The translating architecture of claim 11 wherein said first signal environment is composed of ECL logic level signals and said second signal environment is composed of one of the set of TTL and CMOS logic signal levels.

13. The translating architecture of claim 11 wherein said first signal environment is composed of one of the set of TTL and CMOS logic signal levels and said second signal environment is composed of ECL logic signal levels.

14. The translating architecture of claim 11 wherein each of said translator circuits is a three-state device.

* * * * *